US011302832B2

(12) United States Patent
Magno et al.

(10) Patent No.: US 11,302,832 B2
(45) Date of Patent: Apr. 12, 2022

(54) OPTICAL SOLAR ENHANCER

(71) Applicant: SEC Optics LLC, Red Bank, NJ (US)

(72) Inventors: John Magno, St. James, NJ (US); John Casper, Cos Cob, CT (US); Thomas Whitonis, Brick, NJ (US); David Stoler, Wanaque, NJ (US)

(73) Assignee: SEC Optics LLC, Red Bank, NJ (US)

( * ) Notice: Subject to any disclaimer, the term of this patent is extended or adjusted under 35 U.S.C. 154(b) by 275 days.

(21) Appl. No.: 15/307,848

(22) PCT Filed: May 1, 2015

(86) PCT No.: PCT/US2015/028704
§ 371 (c)(1),
(2) Date: Oct. 31, 2016

(87) PCT Pub. No.: WO2015/168499
PCT Pub. Date: Nov. 5, 2015

(65) Prior Publication Data
US 2017/0062631 A1  Mar. 2, 2017

Related U.S. Application Data

(60) Provisional application No. 61/987,136, filed on May 1, 2014.

(51) Int. Cl.
*H01L 31/0236* (2006.01)
*H02S 40/22* (2014.01)
(Continued)

(52) U.S. Cl.
CPC ........ *H01L 31/02366* (2013.01); *F24S 23/30* (2018.05); *H01L 31/02325* (2013.01);
(Continued)

(58) Field of Classification Search
CPC .......... H01L 31/02366; H01L 31/0543; H01L 31/0547
See application file for complete search history.

(56) References Cited

U.S. PATENT DOCUMENTS

2007/0089778 A1  4/2007  Horne et al.
2007/0193620 A1  8/2007  Hines et al.
(Continued)

FOREIGN PATENT DOCUMENTS

EP    2249399 A1   11/2010
WO    2009063822 A1  5/2009
(Continued)

OTHER PUBLICATIONS

International Search Report and Written Opinion of the International Searching Authority dated Aug. 5, 2015 for International Patent Application No. PCT/US2015/028704.
(Continued)

*Primary Examiner* — Tae-Sik Kang
(74) *Attorney, Agent, or Firm* — Reed Smith LLP

(57) ABSTRACT

An optical solar enhancer comprises a panel that has a top surface and a bottom surface and an imaginary central plane that extends between the top surface and the bottom surface. The panel includes a plurality of generally parallel features configured to variably increase radiant energy entering the top surface at an acute angle relative to the central plane such that the effect is strongest at lower angles (early morning and late day sun) and weakest at higher angles (mid-day sun) and then redirect the increased radiant energy through the bottom surface.

21 Claims, 10 Drawing Sheets

(51) Int. Cl.
*H01L 31/054* (2014.01)
*F24S 23/30* (2018.01)
*H01L 31/0232* (2014.01)

(52) U.S. Cl.
CPC ...... *H01L 31/0543* (2014.12); *H01L 31/0547* (2014.12); *H02S 40/22* (2014.12); *Y02E 10/40* (2013.01); *Y02E 10/52* (2013.01)

(56) References Cited

U.S. PATENT DOCUMENTS

| | | |
|---|---|---|
| 2007/0256732 A1 | 11/2007 | Shen |
| 2010/0181014 A1 | 7/2010 | Raymond et al. |
| 2011/0083741 A1 | 4/2011 | Munro |
| 2011/0317430 A1 | 12/2011 | Hartwig et al. |
| 2012/0012741 A1* | 1/2012 | Vasylyev ............... G01J 1/0407 250/237 R |
| 2012/0167946 A1 | 7/2012 | Maheshwari et al. |
| 2013/0233384 A1 | 9/2013 | Morgan et al. |
| 2014/0053477 A1 | 2/2014 | Akkashian et al. |
| 2015/0083193 A1* | 3/2015 | Ueda ................ H01L 31/02168 136/246 |
| 2016/0284910 A1* | 9/2016 | Bouchard ........... H01L 31/0543 |

FOREIGN PATENT DOCUMENTS

| | | |
|---|---|---|
| WO | 2013/096824 A1 | 6/2013 |
| WO | WO-2013147008 A1 * | 10/2013 |

OTHER PUBLICATIONS

Extended European Search Report dated Jan. 4, 2018 for European Patent Application No. 15786655.9.

Communication Pursuant to Article 94(3) EPC for European Patent Application No. 15786655.9 dated Nov. 4, 2019, 4 pages.

* cited by examiner

OPTICAL SOLAR ENHANCER

CROSS-REFERENCE TO RELATED APPLICATIONS

This application is a U.S. National Stage of International Patent Application No. PCT/US2015/028704, filed May 1, 2015, which claims the benefit of U.S. Provisional Patent Application No. 61/987,136 filed May 1, 2014 entitled "Optical Solar Enhancer", all of which are incorporated by reference herein in their entirety.

BACKGROUND OF THE INVENTION

The present invention generally relates to an optical solar enhancer, and in some embodiments, photovoltaic (PV) enhancement panels or films for use with or in solar panels, arrays, or modules (or with individual solar cells or other PV device) to improve solar efficiencies.

BRIEF SUMMARY OF THE INVENTION

In one embodiment there is an optical solar enhancer comprising a panel having a top surface and a bottom surface and an imaginary central plane extending between the top surface and the bottom surface, the panel including a plurality of generally parallel features configured to increase radiant energy entering the top surface at an acute angle relative to the central plane and redirect the increased radiant energy through the bottom surface. In one embodiment, each feature includes a pair of convexly shaped surfaces configured to concentrate the radiant energy to a location below the bottom surface. In one embodiment, the features form a corrugated surface. In one embodiment, at least a portion of the corrugated surface is curved. In one embodiment, the corrugated surface is only convexly curved. In one embodiment, the curve has an increasing radius of curvature. In one embodiment, the shape of the curve is approximated by a fifth order polynomial. In one embodiment, the shape of the curve is approximated by a sixth order polynomial. In one embodiment, the shape of the curve is approximated by a sixth order Bézier curve. In one embodiment, the shape of the curve is approximated by an eighth order Bézier curve.

In one embodiment, the panel has a generally constant cross section across its width. In one embodiment, the panel is comprised of polymethyl methacrylate (PMMA). In one embodiment, the panel includes at least one film coupled to the top surface. In one embodiment, the bottom surface is planar. In one embodiment, the panel does not increase radiant energy at an angle normal to the central plane. In one embodiment, the panel is a unitary structure. In one embodiment, the parallel features are configured to variably increase the radiant energy entering the top surface depending on the acute angle relative to the central plane. In one embodiment, the refractive index varies from the top surface to the bottom surface. In one embodiment, the panel is comprised of two or more materials each having a different index of refraction.

In another embodiment there is a photovoltaic system comprising a photovoltaic panel having a top surface; and an optical solar enhancer according to any of the preceding claims coupled to the top surface of the photovoltaic panel.

In another embodiment there is a photovoltaic system comprising: a photovoltaic panel having a top surface; and an optical solar enhancer having a panel, the panel having a top surface and a bottom surface and an imaginary central plane extending between the top surface and the bottom surface, the panel including a plurality of generally parallel features configured to increase radiant energy entering the top surface at an acute angle relative to the central plane and redirect the increased radiant energy through the bottom surface. In one embodiment, the optical solar enhancer includes a plurality of spacers projecting from a bottom surface, the spacers configured to space the bottom surface of the optical solar enhancer from the top surface of the photovoltaic panel. In one embodiment, each spacer has a generally diamond shaped cross section along a plane parallel with the central plane of the optical solar enhancer. In one embodiment, an initial current output of the photovoltaic panel without the optical solar enhancer over one day of sun exposure has a generally bell shaped curve with respect to time, wherein when the optical solar enhancer is coupled with the photovoltaic panel the photovoltaic panel having an increased current output when the sun is at an acute angle relative to the photovoltaic panel, a maximum current output of the photovoltaic panel remaining generally the same with and without the optical solar enhancer.

In one embodiment, the initial current output of the photovoltaic panel when the sun is at an acute angle relative to the photovoltaic panel increases by at least 10% when the optical solar enhancer is coupled with the photovoltaic panel. In one embodiment, an initial current output of the photovoltaic panel without the optical solar enhancer over one day of sun exposure has a generally bell shaped curve with respect to time, wherein when the optical solar enhancer is coupled with the photovoltaic panel the photovoltaic panel having an increased current output when the sun is at an acute angle relative to the photovoltaic panel, a maximum current output of the photovoltaic panel decreasing with the optical solar enhancer as compared to a maximum current output of the photovoltaic panel without the optical solar enhancer.

In one embodiment, the maximum current output of the photovoltaic panel with the optical solar enhancer being at least approximately 2% less than the maximum current output of the photovoltaic panel without the optical solar enhancer. In one embodiment, the optical solar enhancer is coupled to the photovoltaic panel using two or more clips coupled to a periphery of the optical solar enhancer and a periphery of the photovoltaic panel. In one embodiment, the parallel features are configured to variably increase the radiant energy entering the top surface depending on the acute angle relative to the central plane. In one embodiment, the optical solar enhancer is laminated directly to a surface of a solar panel.

BRIEF DESCRIPTION OF THE SEVERAL VIEWS OF THE DRAWINGS

The following detailed description the optical solar enhancer will be better understood when read in conjunction with the appended drawings of exemplary embodiments. It should be understood, however, that the invention is not limited to the precise arrangements and instrumentalities shown.

In the drawings.

DETAILED DESCRIPTION OF THE INVENTION

The present invention is directed to photovoltaic (PV) enhancement panels or films, generally referred to herein as an optical solar enhancer, for use with or in solar panels, arrays, or modules (or with individual solar cells or other PV device) to improve solar efficiencies. The optical solar enhancer may be configured to be applied to existing solar arrays, panels, or modules (i.e., retro-fit) and/or used with solar cells/PV devices during initial manufacture.

Figure 1:
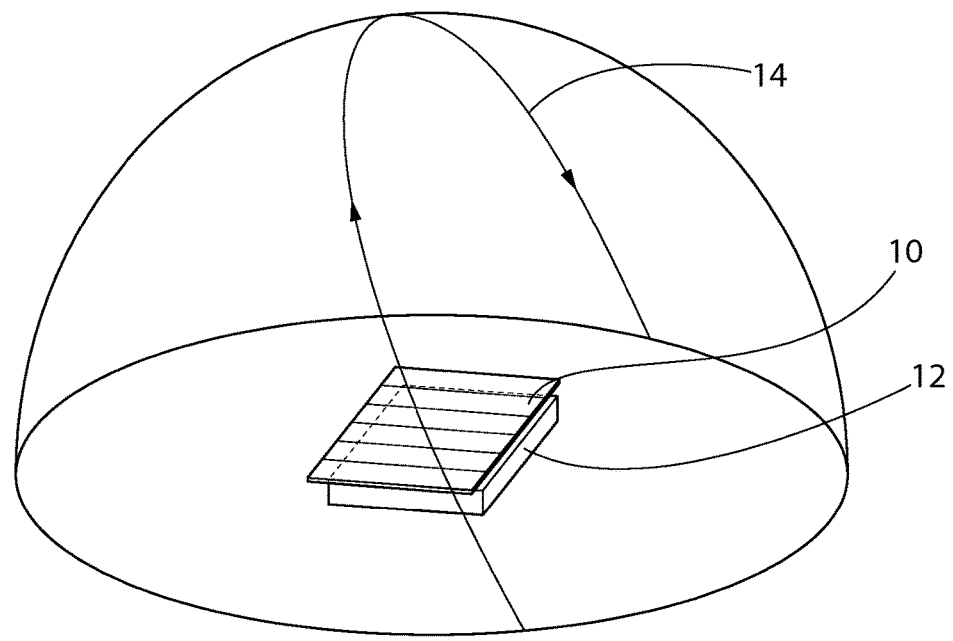
FIG. 1 is a perspective view of an optical solar enhancer in accordance with an exemplary embodiment of the present invention shown mounted on a solar panel and illustrating the path of the sun.
Figure 2:
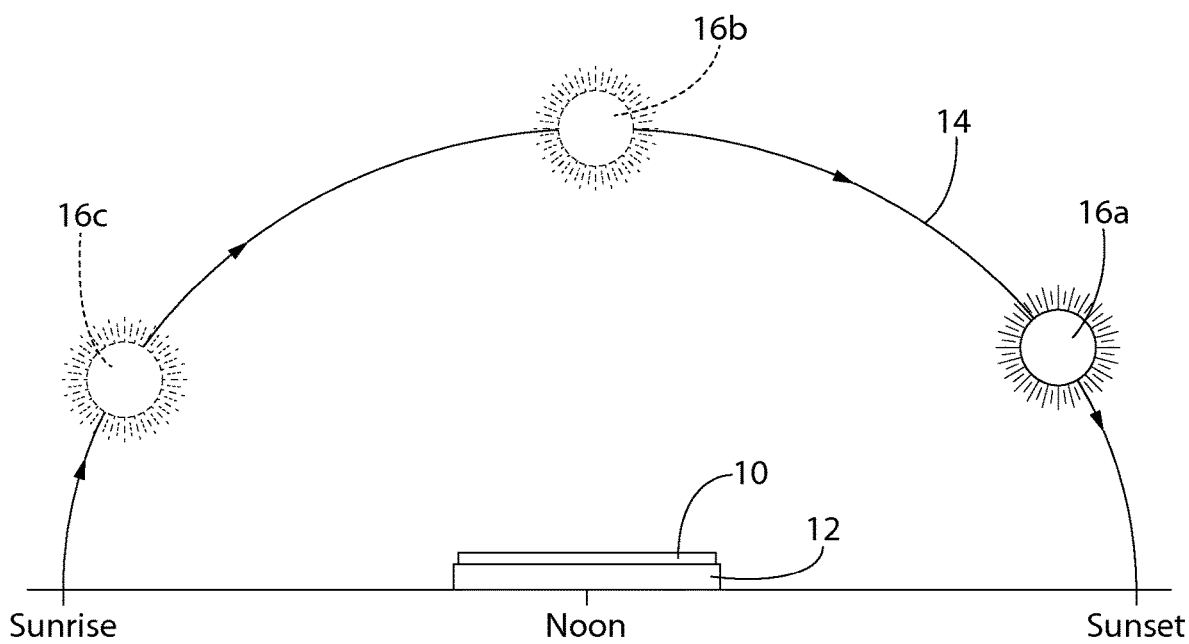
FIG. 2 is a side view of the optical solar enhancer shown in FIG. 1 illustrating the path of the sun.

Referring to FIGS. 1 and 2, most solar panels 12 are installed at a fixed angle relative to the sun's path 14, which means the efficiency of the solar panel 122 declines when the sun is not overhead or the sun's rays are not orthogonal to the solar panel 12 (i.e. during the morning (sun position 16c) and the evening (sun position 16a)). Attempts have been made to reduce this degradation or to improve the sun's photon coupling by adding an anti-reflection (AR) coating to the panels top surface and/or to install the solar panel on a rotating mechanism which tracks the sun across the sky, thereby maintaining the panel's top surface generally orthogonal to the sun's rays. Anti-reflection coatings and tracking systems can be expensive and impractical in certain applications. The optical solar enhancer 10 when coupled to the solar panel 12 increases the coupling of sunlight into the solar panel and thereby improves solar panel efficiency without the need to rotate the solar panel or to add an AR coating to the solar panel.

In one embodiment, the principal function of the optical solar enhancer is to increase the coupling of solar radiation into a solar cell, in order to increase the flux density and the amount of operational hours that the solar panel can produce power. Ideally, the solar panel would be capable of collecting all the available photons from the time the sun rises above the tree line to the time that it sets below the tree line. Conventional glass surfaces on solar panels however are not capable of steering photons into the solar cell at the shallower angles of incidence; especially out beyond 25 degrees from the normal to the plane of the solar panel. The optical solar enhancer efficiently redirects the solar radiation to the solar cells with little or no loss using total internal reflection (TIR) and increases or amplifies the re-directed solar radiation using optical concentration (e.g., a curved surface). The optical solar enhancer comprise of a sheet of material that is attached to the top of a solar panel to increase the electrical output in the morning and afternoon hours when the solar panels electrical production is lowest. The optical solar enhancer may correct for the angular position of the sun and redirects the sun's rays into the solar panel. In one embodiment, the optical solar enhancer includes a plurality of generally parallel features configured to variably increase radiant energy entering its top surface at an acute angle relative to the plane of the solar enhancer such that the effect is strongest at lower angles (early morning and late day sun) and weakest at higher angles (mid-day sun) and then redirect the increased radiant energy through the bottom surface of the solar enhancer to the solar panel.

The structure of the optical solar enhancer may be designed to optimize the efficiency of a solar panel at all angles that are not optimal on a fixed solar panel by increasing the effective area of absorption as the sun moves across the sky. The optical solar enhancer may be considered a hybrid solar energy concentrator and energy trapper. The relative concentrator/trapper combination varies with the incident angle of the sun's radiation. The concentration of light by the solar enhancer is a function of entrance angle of the sun's light relative to the direction normal to the plane of the solar panel. The concentration function of the solar enhancer may be such that the incoming radiation approaching the solar panel at an oblique angle is redirected so that it enters the panel more normal to that panel. In one embodiment, the optical solar enhancer is an angle dependent concentrator that has the most concentration of solar energy at the greatest angles from the normal and reduces the concentration as the angle approaches the panel's normal angle to the sun where the solar panel is at its maximum energy production.

Analysis of solar panels electrical output illustrates a loss of electrical production during the morning and afternoon hours due to atmospheric losses along with non-normal entrance angles to the solar panel. Because of electrical distribution system constraints on maximum power output, an optimal shape of the optical solar enhancer corrects for these losses while not increasing the maximum electrical production during peak solar exposure.

The optical solar enhancer may be attached (e.g., coupled or laminated) to a solar array such that the absorption enhancement structure-side faces the sun and the opposite (typically planar) side abuts the light receiving side and/or surfaces of the solar cells in the solar array (e.g., attached with adhesive to PV material of a solar cell, to a protective glass coating or element, to a layer of AR material(s), or the like).

Figure 3A:
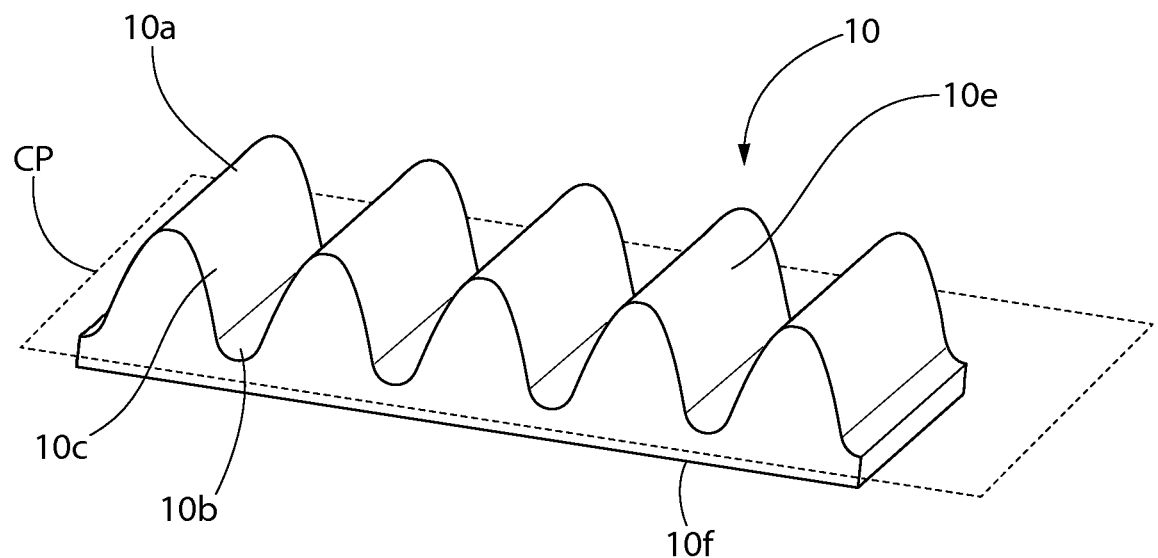
FIG. 3A is a perspective view of a portion of a optical solar enhancer in accordance with an exemplary embodiment of the present invention.
Figure 3B:
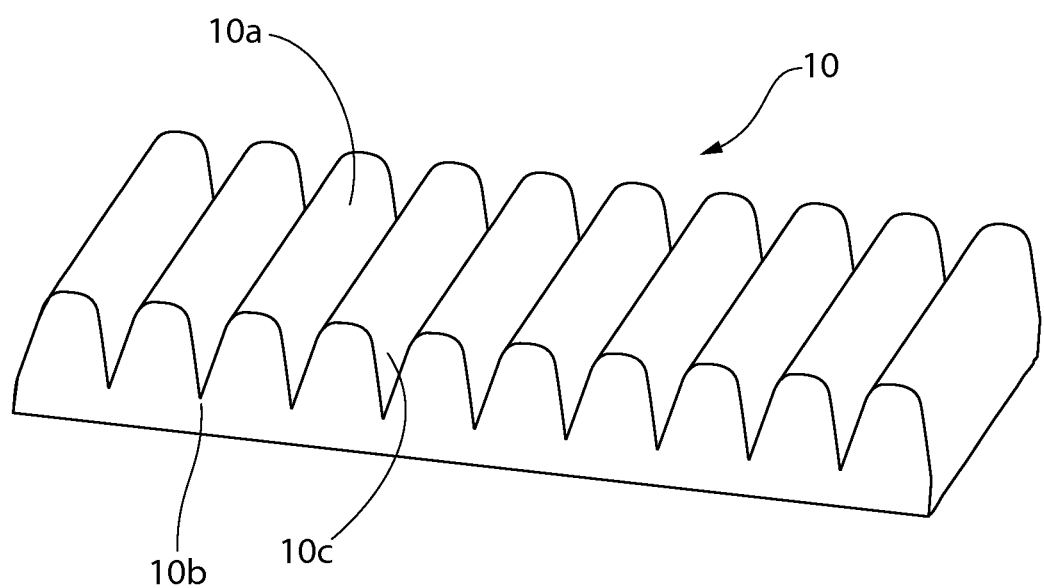
FIG. 3B is a perspective view of a portion of another optical solar enhancer in accordance with an exemplary embodiment of the present invention.
Figure 3C:
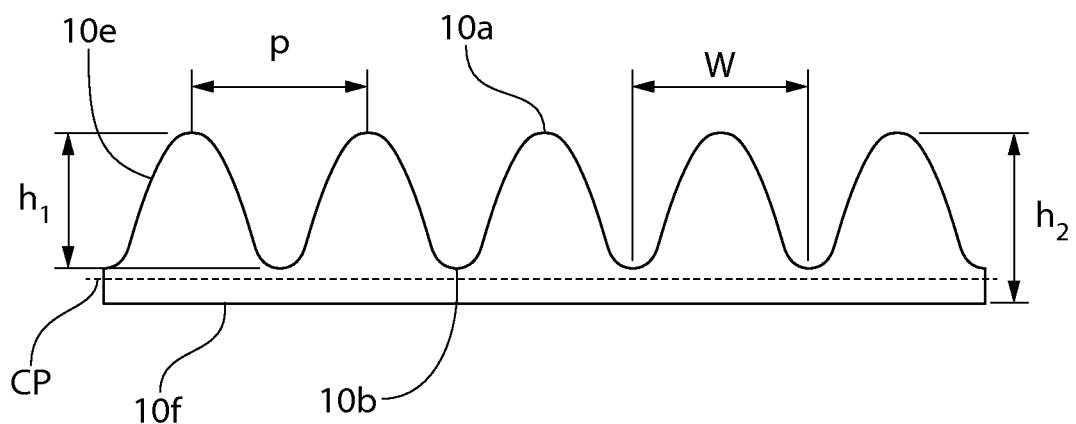
FIG. 3C is a side view of the optical solar enhancer shown in FIG. 3A.
Figure 4:
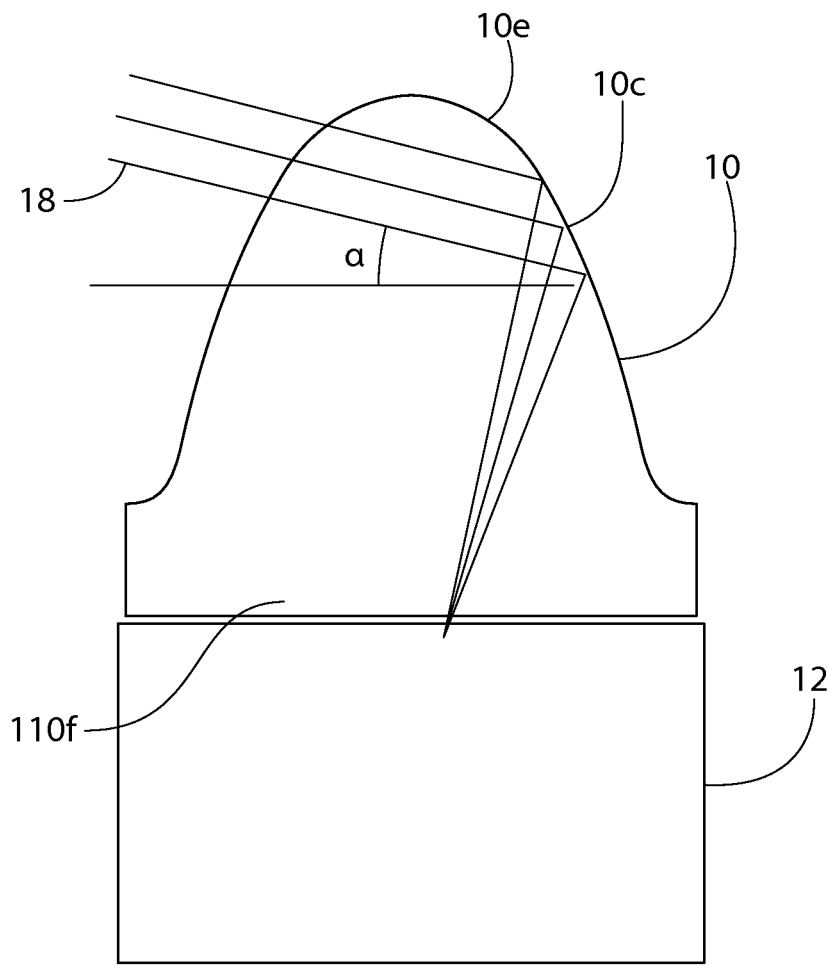
FIG. 4 is an enlarged side view of a portion of the optical solar enhancer shown in FIG. 3A mounted to a solar panel and illustrating the increase in solar radiation.

Referring to FIGS. 3A, 3B and 3C, the optical solar enhancer 10 may include a top, sun facing surface 10e, and a bottom, solar panel facing surface 10f and an imaginary central plane CP extending between the top surface 10e and the bottom surface 10f Referring to FIG. 4, the optical solar enhancer 10 may be configured to increase radiant energy 18 entering the top surface 10e at an acute angle α (see FIG. 4) relative to the central plane CP and redirect the increased radiant energy 18 through the bottom surface 10f and to the solar panel 12.

The top surface 10e of the optical solar enhancer 10 may have a corrugated shape. In one embodiment, the top surface 10e is formed by a plurality of generally parallel valleys or grooves 10b. In one embodiment, the grooves 10b form generally parallel peaks 10a and convexly curved side surfaces 10c extending between the peaks 10a and the grooves 10b. In one embodiment, each groove 10b is positioned between a pair of convexly shaped side surfaces 10c configured to concentrate the radiant energy to a location below the bottom surface 10f from either lateral side.

In some embodiments, the valleys or grooves have a cross-sectional profile that remains constant as one traverses the solar enhancer top surface 10e in the direction of the valleys or grooves (e.g., in and out of the page in FIG. 3C) is generally constant. In other embodiments, the cross sectional shape of the valleys or grooves varies such that the side surfaces 10c converge and/or diverge from one another as one traverses the solar enhancer top surface 10e in the direction of the valleys or grooves. The grooves 10b, peaks 10a and side surfaces 10c may be configured to be oriented orthogonal to the projection of the path of the sun through the sky onto the solar concentrator sun facing surface 10e. In one embodiment, the cross sectional shape of the optical solar enhancer 10 is constant and oriented on the solar panel 12 relative to the path of the sun such that the peaks 10a are generally orthogonal to the path of the sun. In another embodiment, the side surfaces 10c diverge from one another such that when the path of the sun that is lower in the sky (or the position of solar panel 12 makes it difficult to have the surface features be generally orthogonal to the projection of the path of the sun), the direction of the valleys or grooves is closer to orthogonal to the projection of the path of the sun on the sun facing surface 10e than they would have been had the side surfaces 10c been completely parallel to one another. In one embodiment, the peaks 10a extend along a generally straight line (see e.g., FIG. 3B). In other embodiments, the peaks 10a extend along a curved or undulating line.

The top surface 10e of the optical solar enhancer 10 may be completely exposed to the air. In other embodiments, the grooves 10b may be partially or completely filled with a material 22 (see FIGS. 5 and 7) to flatten out the top surface 10e.

Figure 8A:
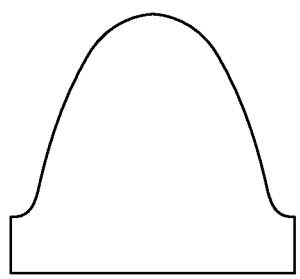
FIG. 8A is a side view of a portion of an optical solar enhancer in accordance with an exemplary embodiment of the present invention.
Figure 8B:
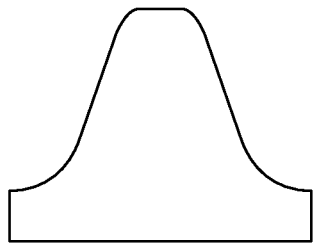
FIG. 8B is a side view of a portion of an optical solar enhancer in accordance with an exemplary embodiment of the present invention.
Figure 8C:
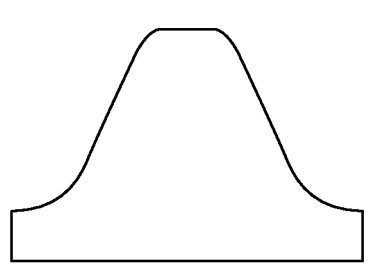
FIG. 8C is a side view of a portion of an optical solar enhancer in accordance with an exemplary embodiment of the present invention.
Figure 8D:
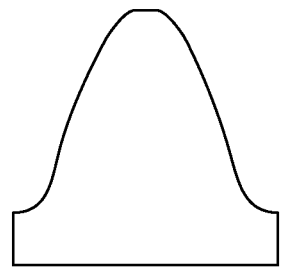
FIG. 8D is a side view of a portion of an optical solar enhancer in accordance with an exemplary embodiment of the present invention.
Figure 8E:
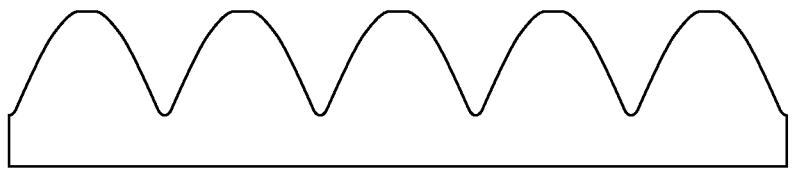
FIG. 8E is a side view of a portion of an optical solar enhancer in accordance with an exemplary embodiment of the present invention.
Figure 8F:
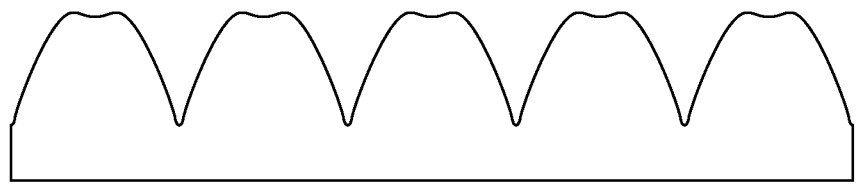
FIG. 8F is a side view of a portion of an optical solar enhancer in accordance with an exemplary embodiment of the present invention.
Figure 8G:
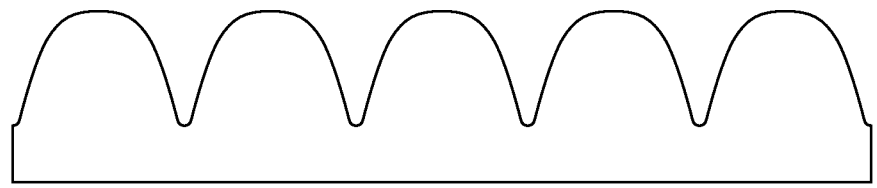
FIG. 8G is a side view of a portion of an optical solar enhancer in accordance with an exemplary embodiment of the present invention.
Figure 8H:
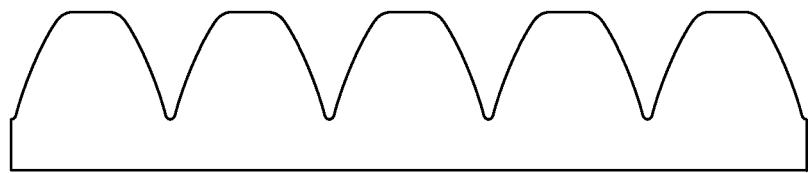
FIG. 8H is a side view of a portion of an optical solar enhancer in accordance with an exemplary embodiment of the present invention.
Figure 8I:
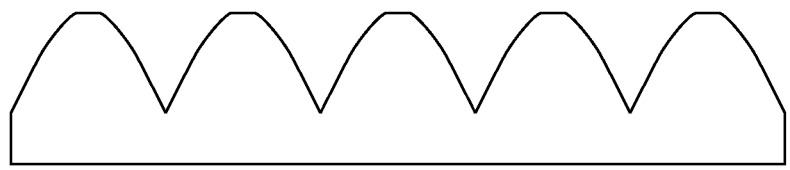
FIG. 8I is a side view of a portion of an optical solar enhancer in accordance with an exemplary embodiment of the present invention.
Figure 8J:
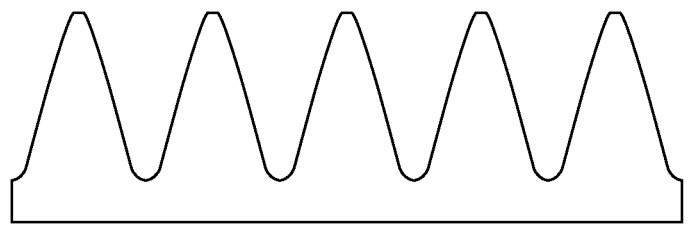
FIG. 8J is a side view of a portion of an optical solar enhancer in accordance with an exemplary embodiment of the present invention.
Figure 8K:
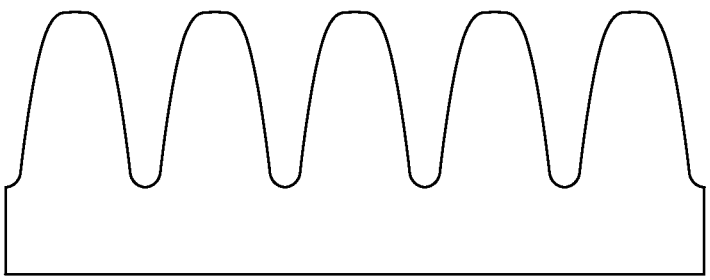
FIG. 8K is a side view of a portion of an optical solar enhancer in accordance with an exemplary embodiment of the present invention.
Figure 8L:
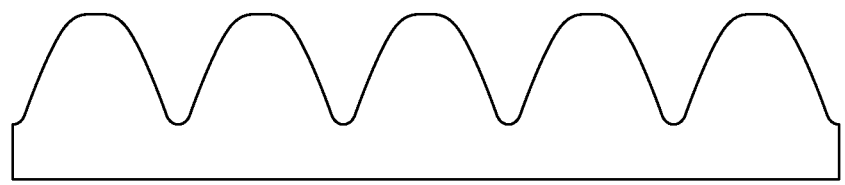
FIG. 8L is a side view of a portion of an optical solar enhancer in accordance with an exemplary embodiment of the present invention.
Figure 8M:
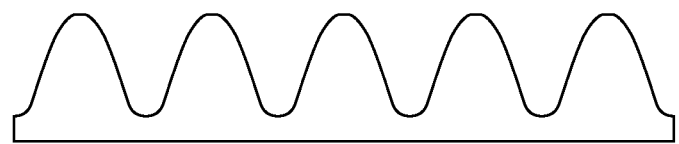
FIG. 8M is a side view of a portion of an optical solar enhancer in accordance with an exemplary embodiment of the present invention.
Figure 8N:
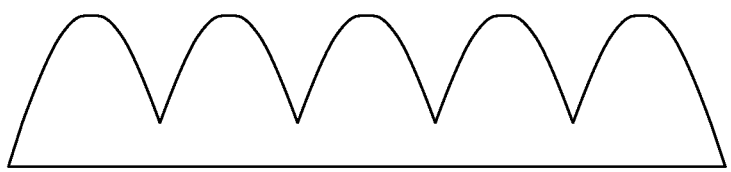
FIG. 8N is a side view of a portion of an optical solar enhancer in accordance with an exemplary embodiment of the present invention.
Figure 8O:
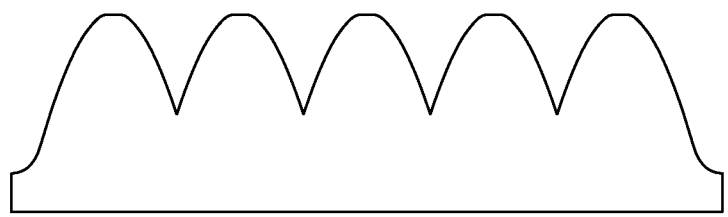
FIG. 8O is a side view of a portion of an optical solar enhancer in accordance with an exemplary embodiment of the present invention.
Figure 8P:
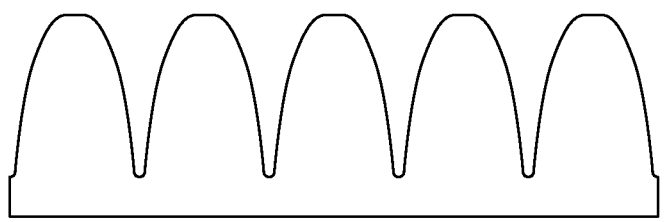
FIG. 8P is a side view of a portion of an optical solar enhancer in accordance with an exemplary embodiment of the present invention.
Figure 8Q:
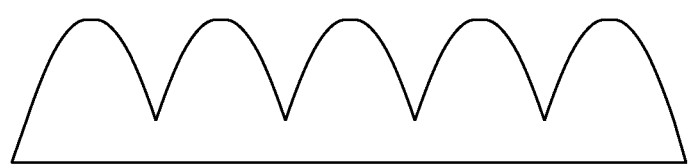
FIG. 8Q is a side view of a portion of an optical solar enhancer in accordance with an exemplary embodiment of the present invention.

Referring to FIG. 3C, the peaks 10a of the corrugated surface may generally lie on a plane that is parallel with the central plane CP. In other embodiments, the peaks 10a may generally lie on a curved imaginary surface (e.g., a single curve or a series of undulating curves). The shape of the top surface 10e may vary widely to practice the invention with arcuate or non-linear side surfaces 10c (see FIGS. 8A-8Q). In one embodiment, the top surface 10e is a periodic, smooth, oscillating shape. In one embodiment, the oscillating shape includes a side surface 10c having at least a portion that has a convex curvature. In one embodiment, the oscillating curved shape is not a sine wave. In one embodiment, the radius of curvature increases from the peak 10a to the groove 10b. In one embodiment, the side surfaces 10c are only convex and meet at a point (see FIG. 8N). In one embodiment, each feature is symmetrical about a vertical plane. The side surfaces 10c may have a curvature described by a mathematical equation. In one embodiment, the side surfaces 10c have a curvature approximated by a higher order polynomial equation, for instance, a fifth or sixth order polynomial equation. In other embodiments, the side surfaces have a curvature approximated by higher order Bezier curves, for instance sixth or eighth order Bézier curves. In one embodiment, the peaks 10a and grooves 10b extend along generally parallel lines. In one embodiment, the optical solar enhancer has a generally constant cross-sectional profile across its width. The peaks 10a may be convexly curved. In one embodiment, the peaks 10a are generally flattened (see FIG. 8B). In one embodiment, the peaks 10a are concave (see FIG. 8F).

Referring to FIG. 4, the curve of side surface 10c may be configured to focus radiant energy 18 onto the surface of solar panel 12 for radiant energy 18 hitting the optical solar enhancer at angles α (relative to the bottom surface 10f) between 0 degrees and 90 degrees. In one embodiment, side surface 10c is curved to increase radiant energy entering the top surface at an acute angle relative to the central plane such that the increase is strongest at lower angles (early morning and late day sun) and weakest at higher angles (mid-day sun). In one embodiment, the side surface 10c increases the radiant energy at an angle α of approximately 5 degrees. In one embodiment, the side surface 10c increases the radiant energy at an angle α of approximately 10 degrees. In one embodiment, the side surface 10c increases the radiant energy at an angle α of approximately 15 degrees. In one embodiment, the side surface 10c increases the radiant energy at an angle α of approximately 20 degrees. In one embodiment, the side surface 10c increases the radiant energy at an angle α of approximately 25 degrees. In one embodiment, the side surface 10c increases the radiant energy at an angle α of approximately 30 degrees. In one embodiment, the side surface 10c increases the radiant energy at an angle α of approximately 35 degrees. In one embodiment, the side surface 10c increases the radiant energy at an angle α of approximately 45 degrees. In one embodiment, the side surface 10c increases the radiant energy at an angle α of approximately 55 degrees. In one embodiment, the side surface 10c increases the radiant energy at an angle α of approximately 60 degrees. In one embodiment, the side surface 10c increases the radiant energy at an angle α of approximately 65 degrees. In one embodiment, the side surface 10c increases the radiant energy at an angle α of approximately 70 degrees. In one embodiment, the side surface 10c increases the radiant energy at an angle α of approximately 75 degrees. In one embodiment, the side surface 10c increases the radiant energy at an angle α of approximately 80 degrees. In one embodiment, the side surface 10c increases the radiant energy at an angle α of approximately 85 degrees.

Referring to FIG. 3C, the size of the surface features may be varied to practice the invention with some embodiments utilizing features as small as about 300 nm in width w while others use features up to 10 mm or more in width w. The height h1 (or thickness) of the features may also be varied, with some embodiments being very thin (e.g., about 300 nm) while others are relatively thick (e.g., up to about 10 mm or more in height). The space between the bottom surface 10f and the grooves 10b may be varied to increase or decrease the overall height h2 or thickness of the optical solar enhancer 10. The distance between the grooves 10b and the bottom surface 10f may be increased to increase the strength of the optical solar enhancer and prevent it from breaking along a groove 10b. In one embodiment, the optical solar enhancer is a thin, 10 nm-1 cm in thickness, flexible film. In one exemplary embodiment, the optical solar enhancer is approximately 50 μm in thickness.

By having the curved surface features, the optical solar enhancer may increase the effective area of absorption of the corresponding solar panel. In one embodiment, coupling the optical solar enhancer to the solar panel increases the effective area of absorption of the solar panel by approximately 1.25×. In one embodiment, coupling the optical solar enhancer to the solar panel increases the effective area of absorption of the solar panel by approximately 1.5×. In one embodiment, coupling the optical solar enhancer to the solar panel increases the effective area of absorption of the solar panel by approximately 1.75×. In one embodiment, coupling the optical solar enhancer to the solar panel increases the effective area of absorption of the solar panel by approximately 2.0×. In one embodiment, coupling the optical solar enhancer to the solar panel increases the effective area of absorption of the solar panel by approximately 2.25×. In one embodiment, coupling the optical solar enhancer to the solar panel increases the effective area of absorption of the solar panel by approximately 2.50×. In one embodiment, coupling the optical solar enhancer to the solar panel increases the effective area of absorption of the solar panel by approximately 2.75×. In one embodiment, coupling the optical solar enhancer to the solar panel increases the effective area of absorption of the solar panel by approximately 3.0×. In one embodiment, coupling the optical solar enhancer to the solar panel increases the effective area of absorption of the solar panel by greater than 3.0×. In one embodiment, the optical solar enhancer is a non-imaging device.

The optical solar enhancer 10 may or may not be homogeneous in terms of refractive index throughout its structure. In other embodiments, the optical solar enhancer 10 may or may not be homogeneous in its structure wherein the index of refraction has the same constant value throughout. In other embodiments, the optical solar enhancer 10 may or may not have the same constant index of refraction throughout its structure.

Figure 5:
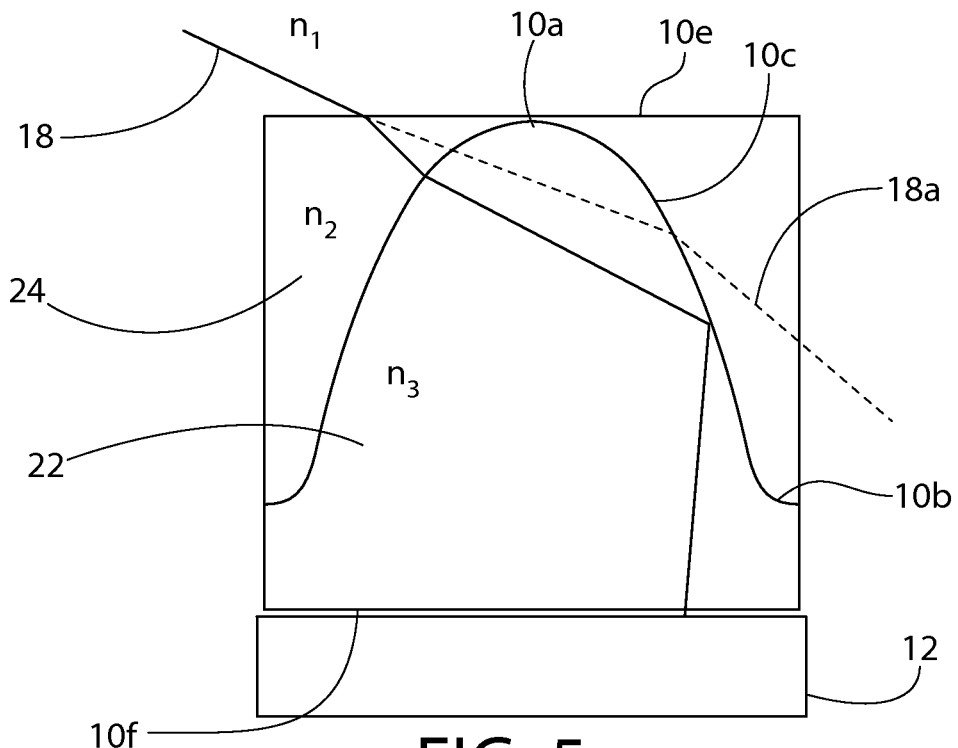
FIG. 5 is an enlarged side view of a portion of an optical solar enhancer in accordance with an exemplary embodiment of the present invention comprised of two materials having different indices of refraction mounted to a solar panel and illustrating the increase in solar radiation
Figure 6:
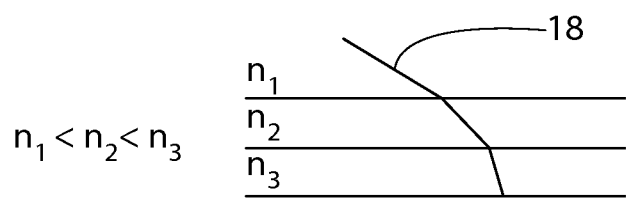
FIG. 6 is a side view of an example of two materials that can be arranged with an exemplary embodiment of the present invention having different indices of refraction to guide radiant energy through the bottom surface.
Figure 7:
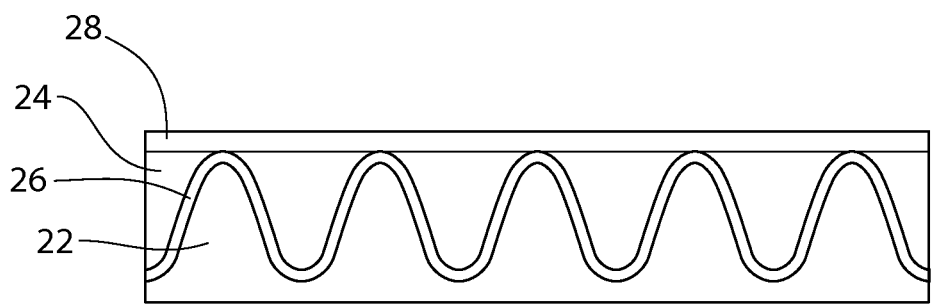
FIG. 7 is a side view of the optical solar enhancer in accordance with an exemplary embodiment of the present invention.

Referring to FIGS. 5-7, the optical solar enhancer 10 may include two or more indices of refraction to guide shallow angle rays toward the solar panel 12. In one embodiment, gradient-index techniques may be used to bend the shallow angle rays toward the solar panel 12 (see FIGS. 5 and 6). In one embodiment, the optical solar enhancer includes two or more materials 22, 24, 26, 28 having different indices of refraction. The core or inner material 22 including the TIR features may include one or more layers 24 and 26 (see FIG. 7) that generally follow the contour of the peaks 10a and grooves 10b. In addition or alternatively, the grooves 10b or the area between peaks 10a may be filled with a material 24 to flatten the top surface 10e of the optical solar enhancer 10. In one embodiment, the grooves 10b are filled such that both the top surface 10e and bottom surface 10f are generally planar. In one embodiment, the ambient air has a refractive index $n_1$, the filler material 24 has a refractive index $n_2$ and the peaks 10a or core of the optical solar enhancer 10 have a refractive index $n_3$ where $n_1 < n_2 < n_3$. Varying the indices of refraction using two or more materials 10, 22, 24, 26 may be used to guide the radiant energy 18 toward the solar panel 12. As shown in FIG. 5, using two materials may help to guide radiant energy 18 toward solar panel 12 where if only the second material 24 was omitted, the radiant energy 18a may not be diverted toward the solar panel In the embodiment shown in FIG. 7, additional layers having a particular index of refraction or coatings such as anti-reflection coatings 28 may be included. In one embodiment, the optical solar enhancer includes at least one film coupled to the top and/or the bottom surface. Layer 26 may have a generally constant thickness. In other embodiments, layer 26 has a variable thickness and/or is only included on a portion of the TIR features (e.g., proximate the curved portions 10c). In one embodiment, the different materials are layered or coupled together such as by using an adhesive to form a composite structure. In other embodiments, the different materials are integrally formed with one another such as by transitioning the material in a 3D printer to build up a unitary structure.

The optical solar enhancer may be made in any manner including molding (such as injection molding, compression molding, and transfer molding), extruding, embossing, hot embossing, casting, continuous casting, cutting, printing, 3D printing, and cold forming. The top curved TIR features may be formed as part of the molding or extruding process or the TIR features may be created through a separate process such as stamping, rolling, etching, printing or rolling a base substrate.

The optical solar enhancer 10 may be comprised of an optical grade or optically clear material such as plastic, glass, ceramic, or crystal. In one embodiment, the material has a transmissivity of greater than approximately 90%. In one embodiment, the material has a transmissivity of greater than approximately 95%. In one embodiment, the material is a highly light transmissive material such as an energy-cured polymer. In one embodiment, the material has refractive index of greater than approximately 1.4. In one embodiment, the material includes environmental stabilizer additives. In one embodiment, the optical solar enhancer is comprised of polymethyl methacrylate (PMMA). In one embodiment, the optical solar enhancer is comprised of polyethylene terephthalate (PET). In one embodiment, the optical solar enhancer is comprised of ACRYLITE® Solar IM20.

The optical solar enhancer 10 may be coupled to a solar panel in any desired manner such as clips, rails, adhesive, insulating foam tape, or double sided tape to attach the optical solar enhancer 10 to the solar panel. In one embodiment, the optical solar enhancer 10 is laminated to or integrally formed in the solar panel. The optical solar enhancer 10 may extend over an entire top surface of the solar panel or a portion. The optical solar enhancer 10 may include a single device per solar panel or the optical solar enhancer 10 may include a plurality of device arranged in an array on a solar panel.

Figure 9A:
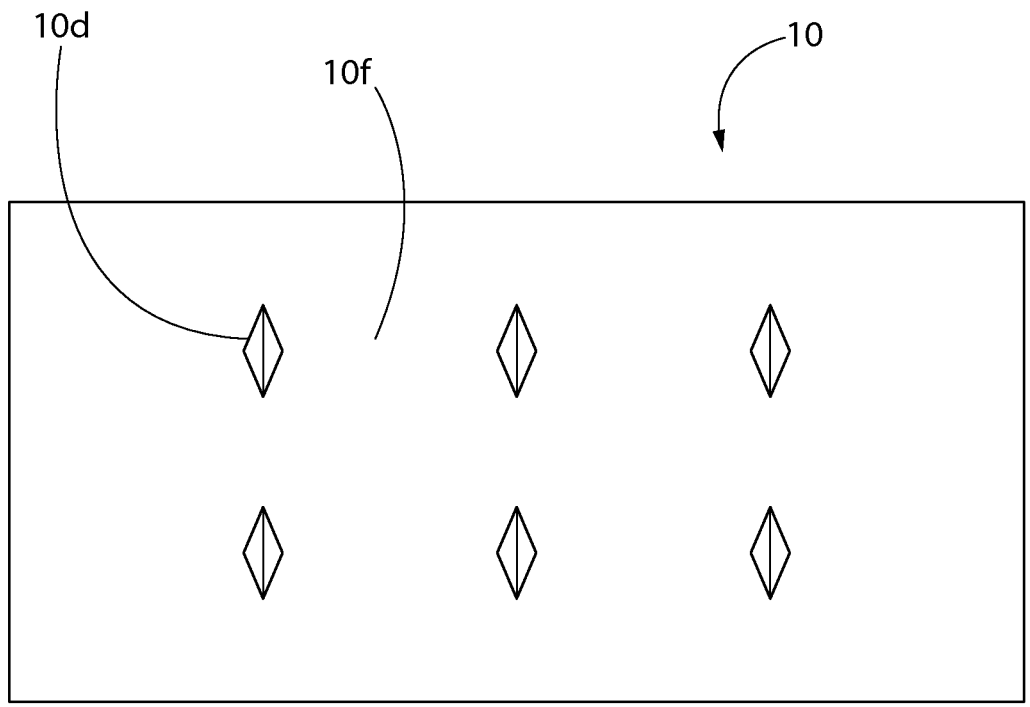
FIG. 9A is a bottom view of an optical solar enhancer in accordance with an exemplary embodiment of the present invention.
Figure 9B:
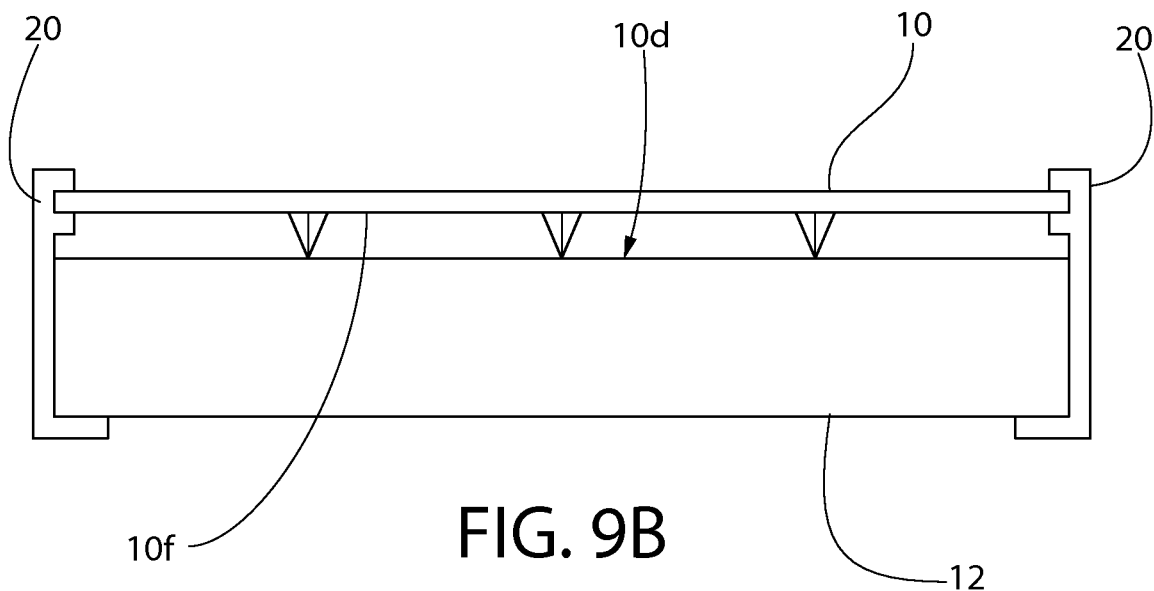
FIG. 9B is a side view of the optical solar enhancer shown in FIG. 9A shown mounted to a solar panel using a pair of clips.

Referring to FIGS. 9A and 9B, the optical solar enhancer 10 may be coupled to the solar panel using one or more clips 20 that snap fit onto the perimeter of the solar panel 12. The clips 20 may be configured to slide over an edge of the optical solar enhancer 10 and compression fit around the bottom of the solar panel 12 to retain the optical solar enhancer 10 on the solar panel. In one embodiment, the optical solar enhancer 10 includes indicia such as arrows or one or more words to indicate which side of the optical solar enhancer 10 faces up and the direction of the grooves/peaks. In one embodiment, the grooves and peaks are positioned generally orthogonal to the path of the sun. In one embodiment, because the features are symmetrical, the optical solar enhancer 10 may be installed on a solar panel in either a first position or a second position 180 horizontally rotated from the first position. In one embodiment, optical solar enhancer 10 may be laminated directly to the surface of the solar panel.

In one embodiment, the optical solar enhancer 10 includes one or more spacers 10d that extend from the bottom surface 10f to offset the optical solar enhancer 10 from the surface of the solar panel. In one embodiment, spacers 10d help to decrease the focal length of the optical solar enhancer 10 and allow for a decreased thickness. The spacers 10d may be integrally formed with the optical solar enhancer 10 or may be attached such as through a snap fit or an adhesive. Because the clips 20 and/or a frame on the solar panel 12 may cause the optical solar enhancer 10 to be spaced from the surface of the solar panel 12, spacers 10d may help to maintain this space and prevent or reduce the optical solar enhancer 10 from sagging in the middle toward the surface of the solar panel 12. The spacers 10d may be shaped to reduce material (e.g., water, dirt, debris) from catching or collecting around the spacers 10d. In one embodiment, the spacers 10d have a pointed or tapered profile in at least one direction such as diamond, triangle, or oval shape to help deflect material toward one side as the material passes between the optical solar enhancer 10 and the solar panel 12.

Figure 10A:
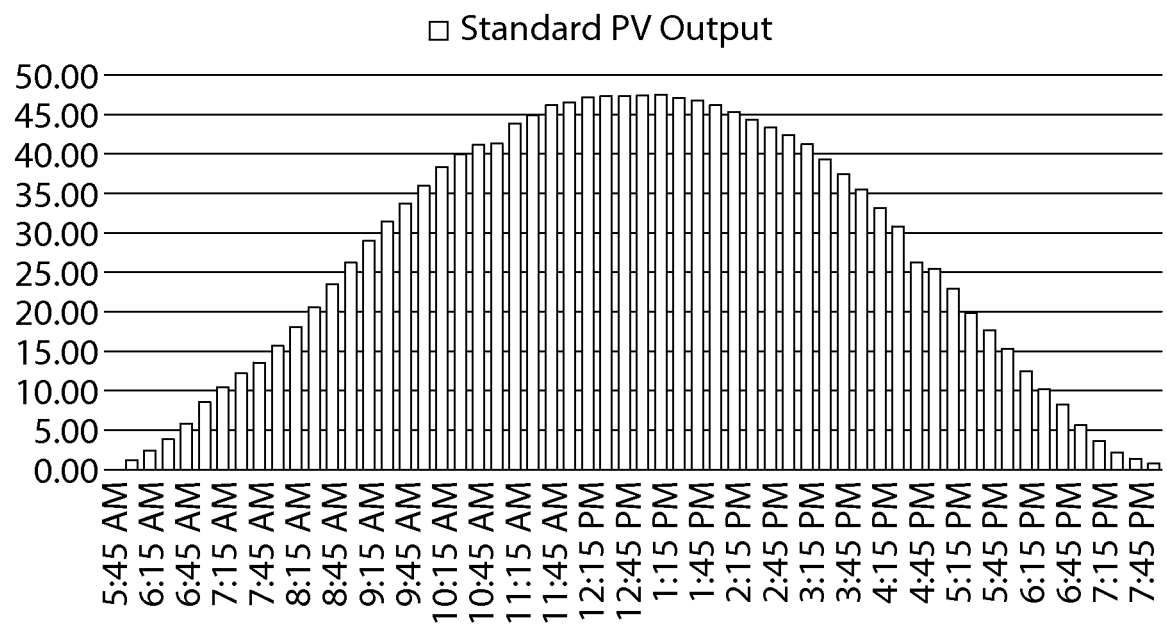
FIG. 10A is a graph of the current output over time of a standard solar panel.

FIG. 10A illustrates data from a rooftop solar farm consisting of 280 solar panels on a clear day located in Edgewater, Maryland. The graph plots the current produced over time, sunrise to sunset. Because the solar panels are fixed in place, the current produced is plotted as a bell shaped curve with the maximum current produced around noon when the sun is generally perpendicular to the solar panel and loss in electrical production during the morning and afternoon hours.

Figure 10B:
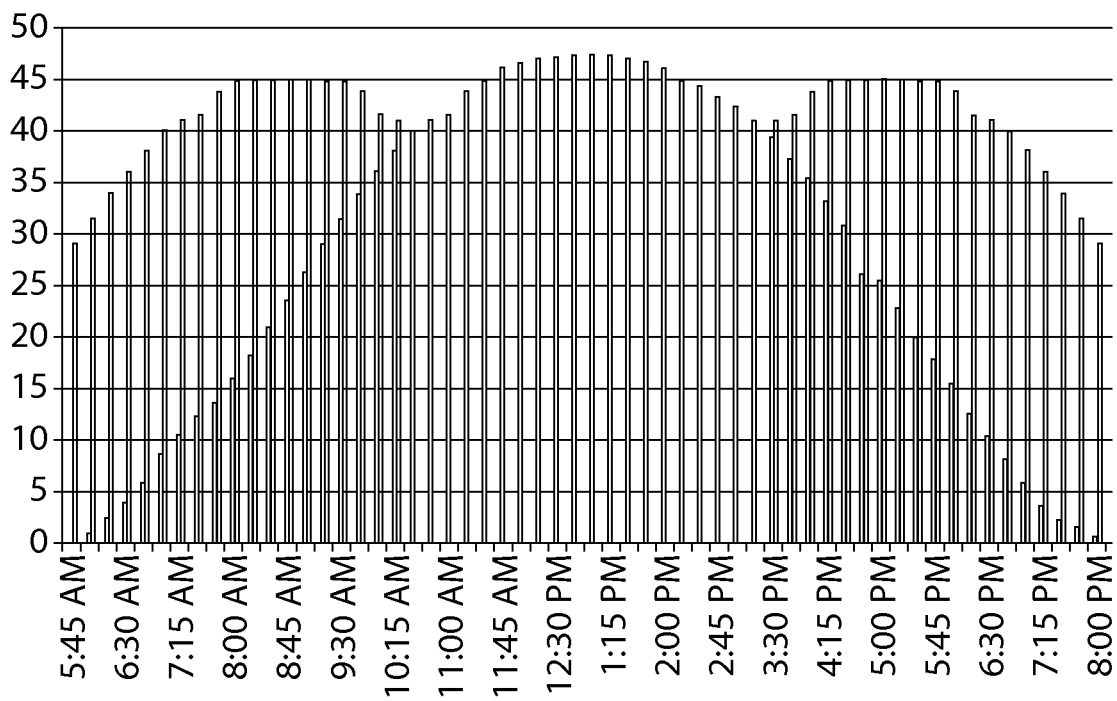
FIG. 10B is a first graph of the current output over time of the solar panel having an optical solar enhancer mounted to its surface.

The optical solar enhancer, in one embodiment, is configured to produce an energy distribution as shown in FIG. 10B. When compared with the solar energy production graph with no optical solar enhancer (see FIG. 10A), the current produced generally fills in the area of which the solar production is the least. In one embodiment, the maximum power produced is not increased by using the optical solar enhancer. This may be important due to the manufacturer's warranty which could be voided if the electrical output was increased during peak production. In one embodiment, the optical solar enhancer never results in the energy production going past the solar panel's standard maximum output at any time. The optical solar enhancer may extend the hours of peak output as shown in FIG. 10B.

In one embodiment, the initial current output of the photovoltaic panel when the sun is at an acute angle relative to the photovoltaic panel increases by at least approximately 10% when the optical solar enhancer is coupled with the photovoltaic panel. In one embodiment, the initial current output of the photovoltaic panel when the sun is at an acute angle relative to the photovoltaic panel increases by at least approximately 20% when the optical solar enhancer is coupled with the photovoltaic panel. In one embodiment, the initial current output of the photovoltaic panel when the sun is at an acute angle relative to the photovoltaic panel increases by at least approximately 30% when the optical solar enhancer is coupled with the photovoltaic panel. In one embodiment, the initial current output of the photovoltaic panel when the sun is at an acute angle relative to the photovoltaic panel increases by at least approximately 40% when the optical solar enhancer is coupled with the photovoltaic panel. In one embodiment, the initial current output of the photovoltaic panel when the sun is at an acute angle relative to the photovoltaic panel increases by at least approximately 50% when the optical solar enhancer is coupled with the photovoltaic panel. In one embodiment, the initial current output of the photovoltaic panel when the sun is at an acute angle relative to the photovoltaic panel increases by at least approximately 60% when the optical solar enhancer is coupled with the photovoltaic panel.

Figure 10C:
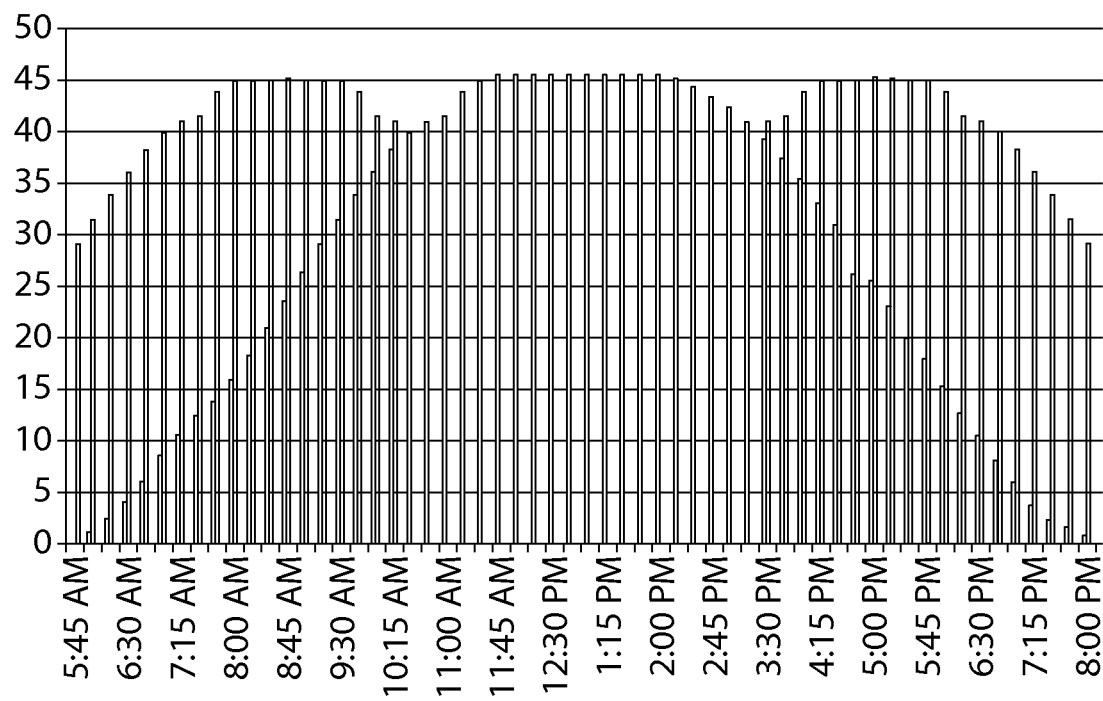
FIG. 10C is a second graph of the current output over time of the solar panel having an optical solar enhancer mounted to its surface.

Referring to FIG. 10C, the solar panel, in combination with the optical solar enhancer, increases the current output during the morning and evening when the sun is at an acute angle relative to the solar panel. In one embodiment, the maximum energy production of the solar panel without the optical solar enhancer is reduced with the use of the optical solar enhancer due to the scattering of the radiant energy off the peaks when the sun is generally orthogonal to the optical solar enhancer. FIG. 10C illustrates that as compared to FIGS. 10A and 10B the top of the curve during the peak hours between 11:45 and 2:00 is reduced or flattened. In one embodiment, the maximum current output of the photovoltaic panel with the optical solar enhancer is at least approximately 0.5% less than the maximum current output of the photovoltaic panel without the optical solar enhancer. In one embodiment, the maximum current output of the photovoltaic panel with the optical solar enhancer is at least approximately 1% less than the maximum current output of the photovoltaic panel without the optical solar enhancer. In one embodiment, the maximum current output of the photovoltaic panel with the optical solar enhancer is at least approximately 1.5% less than the maximum current output of the photovoltaic panel without the optical solar enhancer. In one embodiment, the maximum current output of the photovoltaic panel with the optical solar enhancer is at least approximately 2.0% less than the maximum current output of the photovoltaic panel without the optical solar enhancer. In one embodiment, the maximum current output of the photovoltaic panel with the optical solar enhancer is at least approximately 2.5% less than the maximum current output of the photovoltaic panel without the optical solar enhancer. In one embodiment, the maximum current output of the photovoltaic panel with the optical solar enhancer is at least approximately 3.0% less than the maximum current output of the photovoltaic panel without the optical solar enhancer.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

We claim:

1. An optical solar enhancer comprising:
a panel having a top surface and a bottom surface defining a normal extending perpendicular to the bottom surface, the panel including a plurality of generally parallel features extending along a first length configured to redirect rays of radiant energy entering the top surface of the panel so as to decrease their angle with the normal at the bottom surface,
wherein the plurality of generally parallel features each have a respective uniform cross section along the first length and form a corrugated surface,
wherein each of the plurality of generally parallel features includes a curve extending at least partially between a peak and a valley, and
wherein the curve has an increasing radius of curvature from the peak to the valley,
wherein rays of light passing through the panel are, on average, redirected to have a smaller angle to the normal than they had before entering the panel,
further wherein the top surface of the panel is configured such that portions of rays of radiant energy respectively impinge on and pass through first sections of the surface of each of the generally parallel features at first angles to the normal extending perpendicular to the bottom surface and then impinge on and be reflected from second sections of the surface of the generally parallel features at second angles to said normal such that the second angles to said normal are smaller than the first angles to said normal and such that the portions of the light rays reflected from the second sections of the surface of the generally parallel features then exit the bottom surface of the panel.

2. The optical solar enhancer of claim 1, wherein the curve is a first curve extending toward a first valley, and wherein each of the plurality of generally parallel features includes a second curve extending at least partially between the peak and a second valley, the first curve and second curve forming a pair of opposed convexly shaped surfaces configured to concentrate the radiant energy to a location below the bottom surface.

3. The optical solar enhancer of claim 1, wherein the corrugated surface is only convexly curved.

4. The optical solar enhancer of claim 1, wherein the shape of the curve is approximated by a fifth order polynomial.

5. The optical solar enhancer of claim 1, wherein the shape of the curve is approximated by a sixth order polynomial.

6. The optical solar enhancer of claim 1, wherein the shape of the curve is approximated by a sixth order Bézier curve.

7. The optical solar enhancer of claim 1, wherein the shape of the curve is approximated by a eight order Bézier curve.

8. The optical solar enhancer of claim 1, wherein the panel has a generally constant cross section across its width in a direction parallel to the plurality of generally parallel features.

9. The optical solar enhancer of claim 1, wherein the panel is comprised of polymethyl methacrylate (PMMA).

10. The optical solar enhancer of claim 1, wherein the panel includes at least one film coupled to the top surface.

11. The optical solar enhancer of claim 1, wherein the bottom surface is planar.

12. The optical solar enhancer of claim 1, wherein the panel does not increase radiant energy at an angle normal to the bottom surface.

13. The optical solar enhancer of claim 1, wherein the panel is a unitary structure.

14. The optical solar enhancer of claim 1, wherein the plurality of generally parallel features are configured to variably increase the radiant energy entering the top surface depending on an acute angle relative to an imaginary central plane.

15. The optical solar enhancer of claim 1, wherein each of the plurality of generally parallel features has a maximum height between the valley and the peak greater than a maximum width between adjacent valleys.

16. The optical solar enhancer of claim 1, wherein each of the plurality of generally parallel features is symmetrical about a vertical plane extending through the peak.

17. The optical solar enhancer of claim 1, wherein the peak of each of the plurality of generally parallel features is generally flattened.

18. The optical solar enhancer of claim 1, wherein side surfaces of adjacent generally parallel features meet at a point.

19. The optical solar enhancer of claim 1, wherein each curve of the plurality of generally parallel features are configured to increase radiant energy entering the top surface at an angle relative to an imaginary central plane between about 5 degrees and about 65 degrees and redirect the increased radiant energy through the bottom surface.

20. The optical solar enhancer of claim 1, wherein each curve of the plurality of generally parallel features are configured to increase radiant energy entering the top surface at an angle relative to an imaginary central plane between about 5 degrees and about 25 degrees and redirect the increased radiant energy through the bottom surface.

21. An optical solar enhancer comprising:
a panel having a top surface and a bottom surface defining a normal extending perpendicular to the bottom surface, the panel including a plurality of generally parallel features extending along a first length configured to redirect rays of radiant energy entering the top surface of the panel so as to decrease their angle with the normal at the bottom surface,
wherein the plurality of generally parallel features each have a respective uniform cross section along the first length and form a corrugated surface,
wherein each of the plurality of generally parallel features includes a curve extending at least partially between a peak and a valley, and
wherein the curve has an increasing radius of curvature from the peak to the valley,
wherein rays of light passing through the panel are, on average, redirected to have a smaller angle to the normal than they had before entering the panel,
further wherein portions of the rays of radiant energy respectively impinge on first interfaces of each of the generally parallel features along respective first lines extending in a direction parallel to the bottom surface and at a first angle to each respective normal of the generally parallel features causing the portions of the rays of radiant energy to respectively impinge on second interfaces of each of the generally parallel features along second lines extending in the direction parallel to the bottom surface and at a second angle to each respective normal of the generally parallel features causing the portions of the rays of radiant energy to respectively internally reflect towards the bottom surface.

* * * * *